United States Patent
Barclay et al.

(10) Patent No.: US 8,138,756 B2
(45) Date of Patent: Mar. 20, 2012

(54) MICROFIBER MAGNETOMETER

(75) Inventors: Paul E. Barclay, Palo Alto, CA (US); Raymond G. Beausoleil, Redmond, VA (US); Kai-Mei Camilla Fu, Palo Alto, CA (US); Charles M. Santori, Palo Alto, CA (US); Marco Fiorentino, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 434 days.

(21) Appl. No.: 12/429,876

(22) Filed: Apr. 24, 2009

(65) Prior Publication Data

US 2010/0271016 A1  Oct. 28, 2010

(51) Int. Cl.
G01R 33/02  (2006.01)

(52) U.S. Cl. .................................... 324/244.1; 977/960

(58) Field of Classification Search ............... 324/244.1; 264/1.25; 359/280–284; 977/960
See application file for complete search history.

(56) References Cited

U.S. PATENT DOCUMENTS

| | | | |
|---|---|---|---|
| 3,528,005 A | 9/1970 | Morse et al. | |
| 4,368,430 A | 1/1983 | Dale et al. | |
| 4,675,522 A | 6/1987 | Arunkumar | |
| 5,038,103 A | 8/1991 | Scarzello et al. | |
| 6,504,365 B2 | 1/2003 | Kitamura | |
| 2008/0089367 A1* | 4/2008 | Srinivasan et al. | 372/19 |
| 2010/0315079 A1* | 12/2010 | Lukin et al. | 324/244.1 |

OTHER PUBLICATIONS

Maze, J. R. et al., Nanoscale magnetic sensing using spin qubits in diamond; 2009; Society of Photo-optical instrumentation Engineers; vol. 7225; pp. 1-8.*
Taylor, J. M. et al.; High-sensitivity diamond magnetometer with nanoscale resolution; May 2008; Nature Physics; vol. 4, pp. 1-29.*
Taylor, J. M. et a.; "High-sensitivity Diamond Magnetometer with Nanoscale Resolution"; Sep. 14, 2008; p. 810-816; vol. 4; Macmillan Publishers Limited.
Maze, J. R. et al.; "Nanoscale Magnetic Sensing with an Individual Electronic Spin in Diamond"; Oct. 2, 2008; p. 644-647; vol. 455; Macmillan Publishers Limited.
Balasubramanian, Gopalakrishnan et al.; "Nanoscale Imaging Magnetometry with Diamond Spins Under Ambient Conditions"; Oct. 2008; p. 648-651; vol. 455; Macmillan Publishers Limited.
Degen, C. L.; "Scanning Magnetic Field Microscope with a Diamond Single-Spin Sensor"; Jun. 17, 2008; American Institute of Physics.

* cited by examiner

*Primary Examiner* — Jay Patidar

(57) ABSTRACT

A magnetometer includes a tapered microfiber having a curved portion, an excitation laser in optical communication with the tapered microfiber, and a nanocrystal attached to the curved portion of the tapered microfiber. Laser light emitted from the excitation laser interacts with the nanocrystal to create an emitted photon flux which is monitored to detect a magnetic field passing through the nanocrystal.

13 Claims, 8 Drawing Sheets

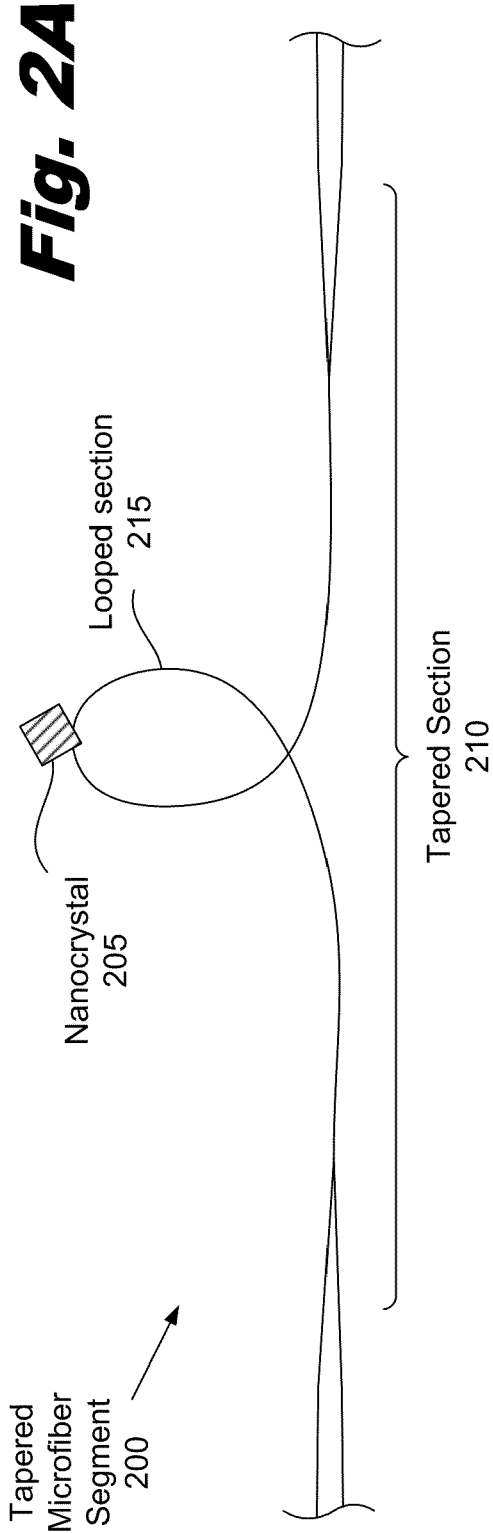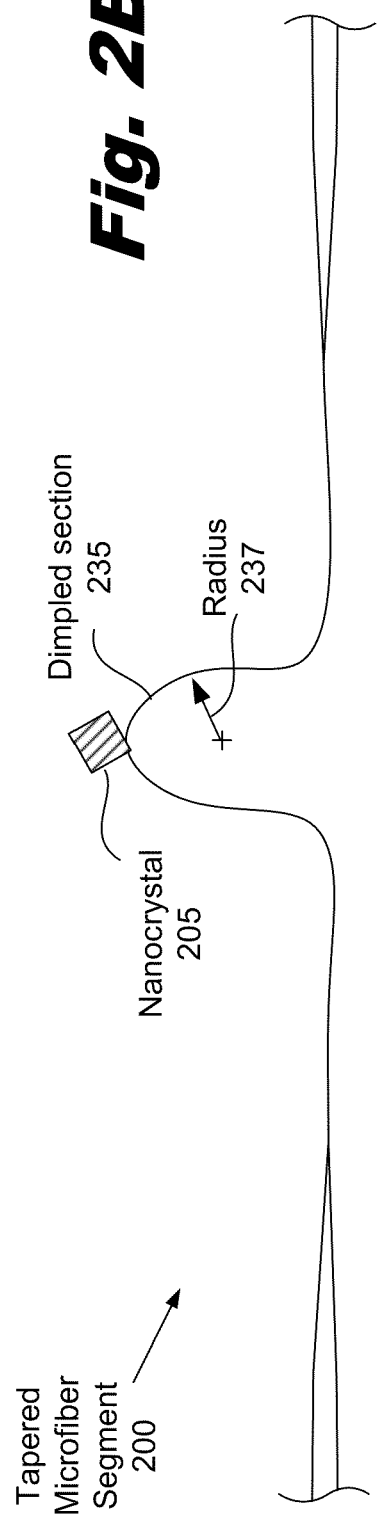

US 8,138,756 B2

MICROFIBER MAGNETOMETER

BACKGROUND

Magnetic fields are vector fields which emanate from magnetic dipoles and moving electrical charges. The detection of weak magnetic fields with high spatial resolution is an important problem in diverse areas such as fundamental physics, materials science, geotechnical exploration, navigation, data storage and biomedical science. A magnetometer is an instrument which is used to measure the strength and/or direction of a magnetic field. It is desirable that a magnetometer be comparatively inexpensive, suitable for operation in a wide range of environments, and provide high sensitivity and spatial resolution.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 2A is a diagram of illustrative tapered microfiber loop with an attached nanocrystal, according to one embodiment of principles described herein.

FIG. 2B is a diagram of illustrative tapered microfiber dimple with an attached nanocrystal, according to one embodiment of principles described herein.

DETAILED DESCRIPTION

Figure 1:
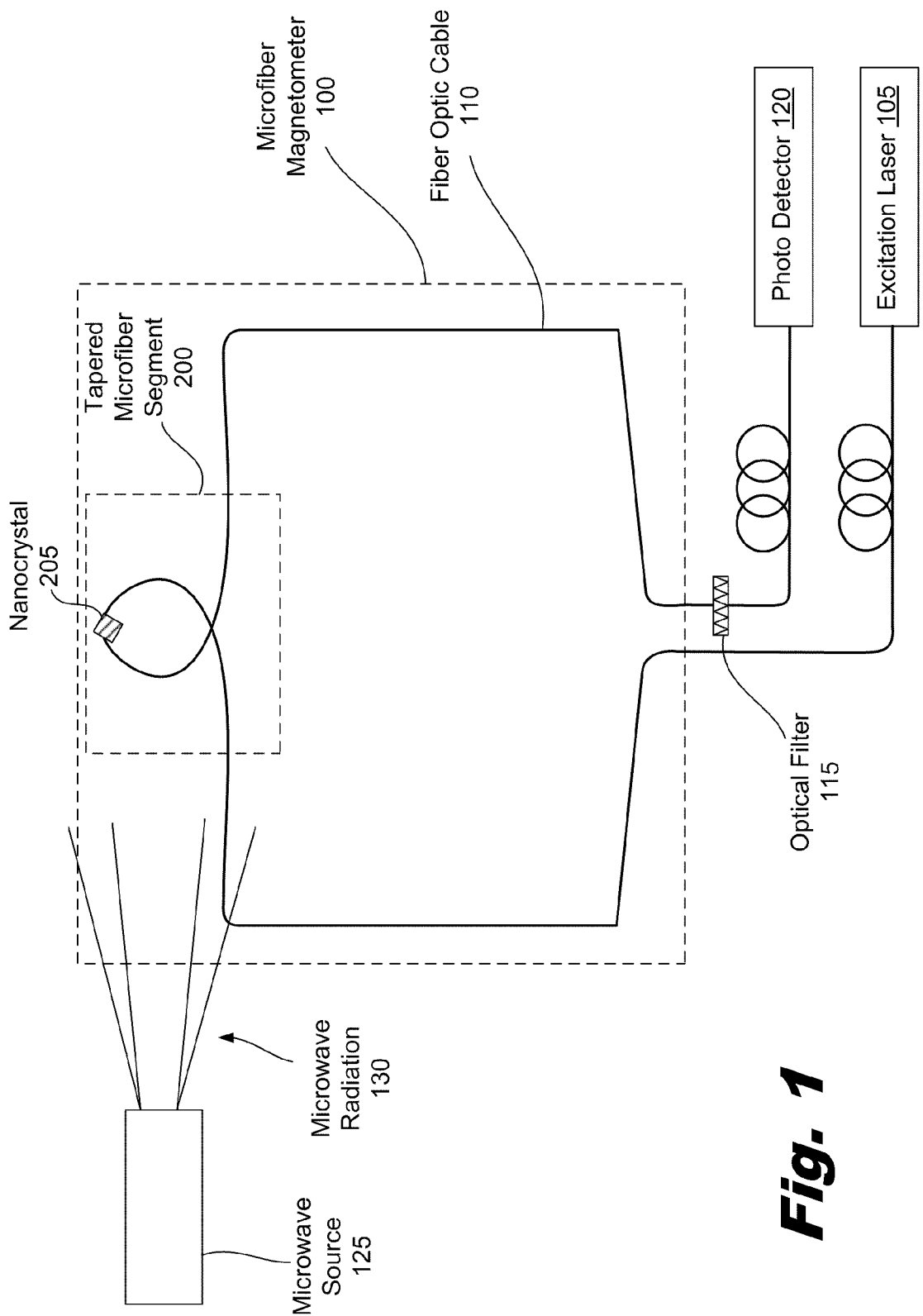
FIG. 1 is a schematic view of an illustrative microfiber magnetometer, according one embodiment of principles described herein.

Magnetic fields are vector fields which emanate from magnetic dipoles and moving electrical charges. The detection of weak magnetic fields with high spatial resolution is an important problem in diverse areas such as fundamental physics, materials science, military surveillance, geotechnical exploration, navigation, data storage and biomedical science.

Measuring small magnetic fields with high spatial resolution is typically performed using expensive instruments which, unfortunately, are also sensitive to other non-magnetic sources of noise. For example, superconducting magnetometers, which provide extremely high sensitivity and imaging resolution, must be cooled to cryogenic temperatures and thermally isolated from their surrounding environment. One example of a superconducting magnetometer is superconducting quantum interference device (SQUID). Superconducting quantum interference devices may be very precise but require very low temperatures to operate appropriately. These low temperatures are usually accomplished with liquid helium or liquid nitrogen which can be costly, dangerous and inconvenient.

Magnetic force magnetometry, another technique which provides high sensitivity and resolution, can only be used to study fields from samples on the lab bench, and must be isolated from vibrations. Neither of these superconducting or magnetic force techniques can be easily used outside of a laboratory setting. For example, magnetic force microscopes are bulky, usually cannot be easily transported, and are susceptible to vibrations. Other magnetometers based on atomic vapors or coils of wire do not provide high spatial resolution.

This specification describes an illustrative microfiber magnetometer which is comparatively inexpensive, can be operated in a wide range of environments, and provides high sensitivity and spatial resolution. According to one illustrative embodiment, the illustrative magnetometer includes a tapered microfiber segment formed in a continuous optical fiber, an excitation laser in optical communication with a first end of the optical fiber, a nanocrystal attached to microfiber segment, and an optical detector in optical communication with a second end of the fiber optic loop. The nanocrystal exhibits optically detected magnetic resonance (i.e. the nanocrystal has photoluminescent properties which are sensitive to external magnetic fields). According to one illustrative embodiment, the electronic ground states of nitrogen vacancy defects within a diamond nanocrystal are split in the presence of a magnetic field. The laser light emitted from the excitation laser excites the nanocrystal, which emits a photon flux as excited electrons drop back to the ground states. The magnitude of the optical emission from the excited nanocrystal is suppressed when the nanocrystal is exposed to microwave radiation whose frequency is resonant with a ground state splitting of the nitrogen vacancy electronic structure in the nanocrystal. This photon flux is then detected by the optical detector. Magnetic fields or magnetic field fluctuations can be measured by monitoring the photon flux for a drop in intensity when the microwave frequency is swept through the ground state resonance.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a schematic view of an illustrative microfiber magnetometer (100). The microfiber magnetometer (100) includes an excitation laser (105) which is in optical communication with a fiber optic cable (110). The fiber optic cable (110) extends to a tapered microfiber segment (200) in the fiber optic cable (110).

Light emitted by the excitation laser (105) will follow the optical path provided by the fiber optic cable (110) and will continue to the microfiber segment (200) of the fiber optic cable (110). At the microfiber segment (200) the excitation laser photons evanescently interact with the environment surrounding the fiber optic cable (110). Those photons interact with a nanocrystal (205) attached to the tapered portion of the fiber optic cable (200). The nanocrystal (205) is stimulated by the evanescent optical energy coupled from the tapered microfiber segment (200) and emits photons. According to one illustrative embodiment, the photons emitted by the nanocrystal have a different wavelength than the photons produced by the excitation laser. These photons emitted by the nanocrystal (205) are captured into guided modes of the microfiber segment (200) of the fiber optic cable (110). The opposing end of the microfiber segment (200) is again in optical communication with a fiber optic cable (110) which allows the photons emitted by the nanocrystal to propagate through an optical filter (115) and to a photodetector (120). The optical filter prevents any excitation laser (105) photons from reaching the photodetector (120) and thereby adversely affecting any measurements produced by the photodetector (120). According to one illustrative embodiment, the optical filter (115) may be a band pass filter which is tuned to allow only the portion of light through the filter which is emitted by the nanocrystal (205). For example, the optical filter could be an absorptive filter which absorbs at the laser wavelength but transmits at longer wavelengths. In alternative embodiments, the filter may be a notch filter, a long pass filter, or a dichroic beam splitter.

The magnitude of the optical emission from the excited nanocrystal (205) is suppressed by placing the nanocrystal (205) in a microwave field (130), whenever the microwave frequency matches a spin resonance condition of the nanocrystal. This microwave field (130) is produced by a microwave source (125) and is directed towards the nanocrystal (205). This microwave field (130) can be supplied by connecting the microwave source (125) to a conducting strip placed near the nanocrystal (205), preferably in the range of a few millimeters. This conductive strip can be energized by electrical signals with a microwave frequency and radiates microwaves which permeate the nanocrystal. Additionally or alternatively, another microwave antenna, coil or resonator may be used. The length of the fiber optic cable (110) is variable according to the user's wants and needs. This allows the microfiber magnetometer (100) to be used in various locations which are remote from the photodetector (120) and the excitation laser (105).

FIG. 2A is a diagram of the illustrative tapered microfiber segment with a looped section (215). According to one illustrative embodiment, the tapered microfiber segment (200) is created by heating and stretching a section of the fiber optic cable (110, FIG. 1). As the fiber optic cable is heated, the material which makes up the fiber optic cable softens, allowing it to be drawn into a gradually tapering section (210). The tapered section (210) is then turned 180 degrees to form a loop section (215). After the loop section (215) and tapered section (210) have been formed, a nanocrystal (205) is attached to the loop section (215).

FIG. 2B shows an illustrative tapered microfiber segment (200) which has a dimpled section (235) in the narrowest part of the microfiber. As described above, tapered microfiber (200) can be formed by simultaneously heating and pulling an optical fiber to convert the core-guided fiber mode into a fundamental taper mode with evanescent tails that extend into the surrounding medium. According to one illustrative embodiment, the narrowest part of the microfiber (200) is pressed against a silica mold which has the desired radius of curvature. By way of example and not limitation, a silica cylinder with a radius of 10 to 200 microns could be used as the silica mold. The microfiber and mold are heated to allow the microfiber to conform to the mold geometry. The radius (237) of the dimpled section is then substantially the same as that of the silica mold. According to one illustrative embodiment, the radius (237) can be changed by altering the tension in the tapered microfiber (200). After the dimpled section (235) has been formed, a nanocrystal (205) is attached to the dimpled section (253).

Figure 2C:
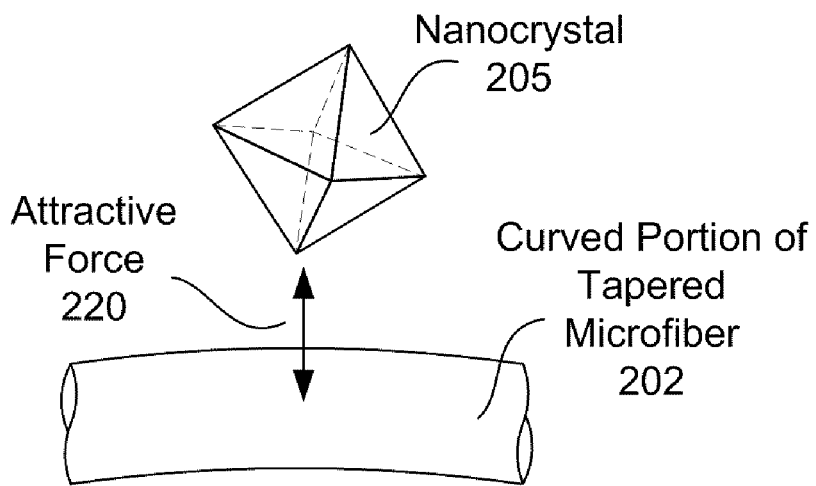
FIGS. 2C and 2D are diagrams of illustrative attachments of a nanocrystal to a curved portion of the microfiber, according to one embodiment of principles described herein.
Figure 2D:
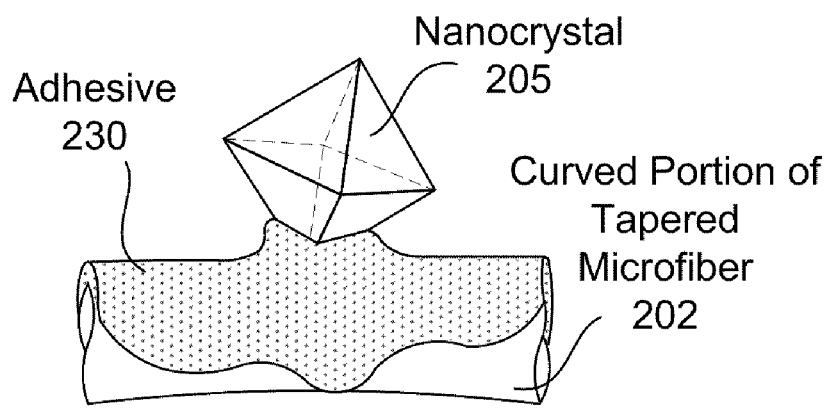

FIGS. 2C and 2D show several illustrative methods for attaching the nanocrystal (205) a curved portion of the tapered microfiber. As illustrated FIGS. 2A and 2B, the curved portion of the tapered microfiber (202) may be a portion of a loop or dimpled section (215, FIG. 2A; 235, FIG. 2B). FIG. 2C shows an illustrative attractive force (220) between the microfiber (200) and the nanocrystal (205). By way of example and not limitation, this attractive force may be van der Waals forces, electrostatic forces, or a combination of both.

FIG. 2D shows an illustrative adhesive (230) which coats a curved portion of the tapered microfiber (202). According to one illustrative embodiment, the curved portion (202) is first dipped or coated in the adhesive (230) and then brought into contact with one or more nanocrystals (205). The nanocrystals (205) are embedded in the adhesive coating (230). In some embodiments, the adhesive (230) may be selected to alter or improve the optical coupling between the nanocrystal (205) and the curved portion (202). For example, an adhesive (230) may be selected that is optically transparent in one or more light ranges. After the nanocrystal (205) is embedded in the adhesive (230), the adhesive may be cured. For example, a UV curing adhesive could be used.

Figure 3A:
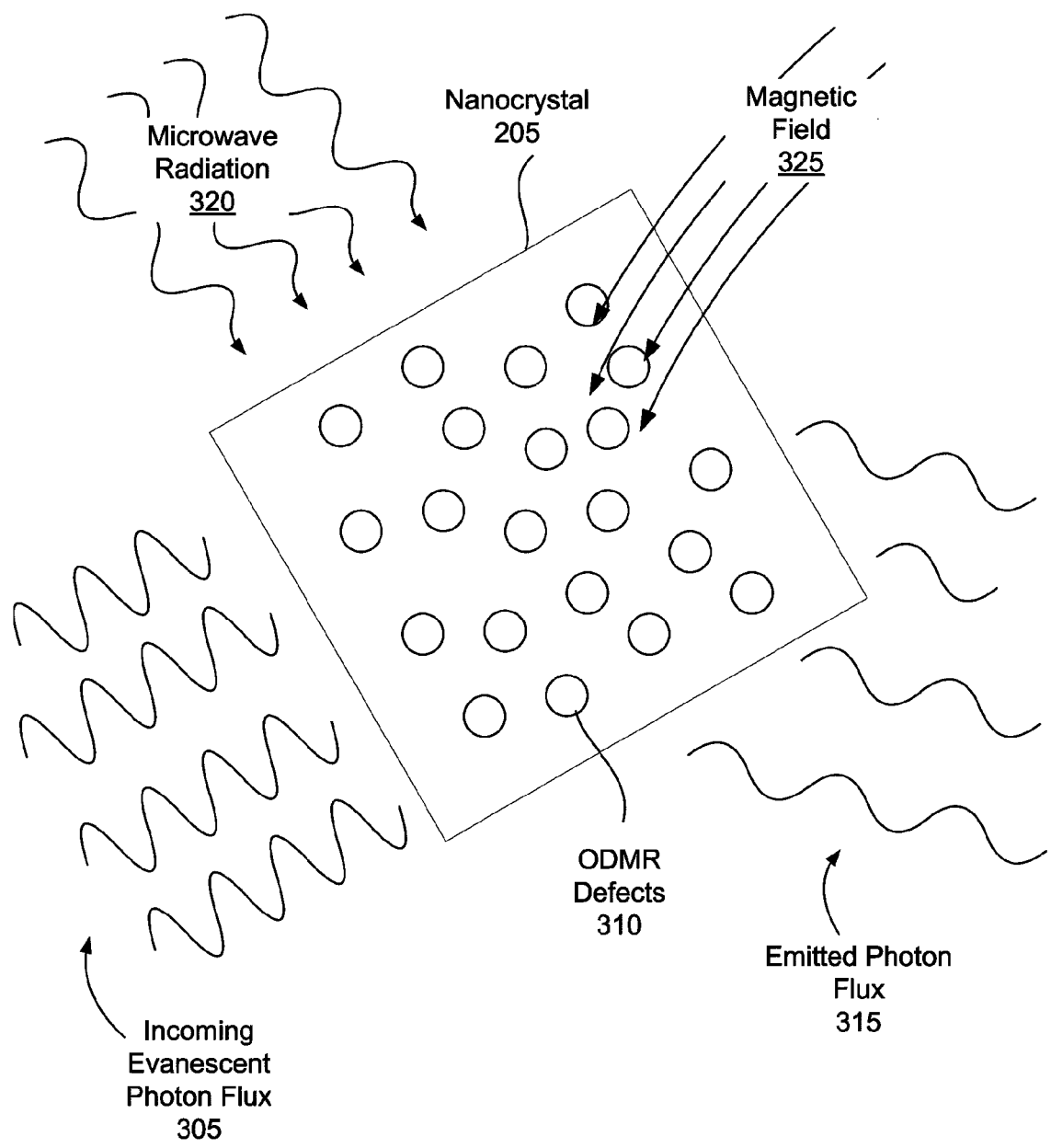
FIG. 3A is a diagram of an illustrative nanocrystal which contains defects which exhibit optically detected magnetic resonance, according to one embodiment of principles described herein.

FIG. 3A is a diagram of an illustrative nanocrystal (205). The nanocrystal (205) could be any nanocrystal with a defect or defects which exhibit optically detected magnetic resonance (ODMR). According to one illustrative embodiment, the nanocrystal (205) is a diamond crystal with a largest dimension of less than 250 nanometers. The diamond nanocrystal includes one or more ODMR defects (310). These ODMR defects (310) can be sensitive to a variety of externally applied fields including microwave radiation (320), incoming evanescent photon flux (305), and magnetic fields (325). The nanocrystal (205) allows the magnetic field to be optically sensed by generating an emitted photon flux (315) which is detected by the photon detector (120, FIG. 1). According to one illustrative embodiment, the ODMR defects are nitrogen vacancy defects (310) within a diamond nanocrystal. A number of other defects within a diamond lattice may exhibit optically detected magnetic resonance, such as silicon and nickel.

Figure 3B:
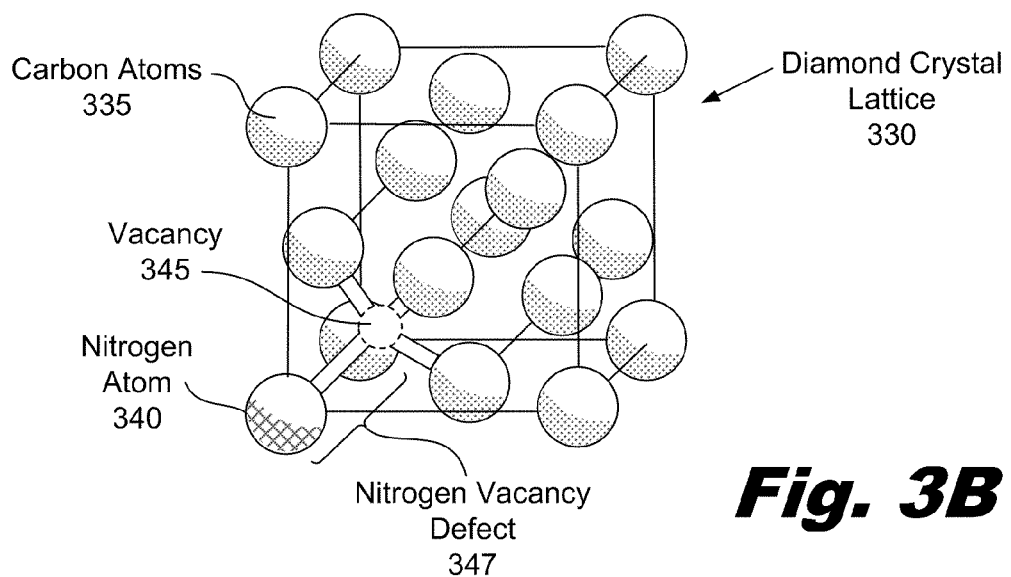
FIG. 3B is a diagram of an illustrative diamond crystal lattice containing a nitrogen vacancy defect, according to one embodiment of principles described herein.

FIG. 3B is an illustrative diagram of a nitrogen vacancy defect (347) within a diamond crystal lattice (330). The nitrogen vacancy defect (347) occurs when a nitrogen atom (340) is substituted for a carbon atom and paired with an adjacent vacancy (345). According to one illustrative embodiment, these nitrogen vacancy defects (347) can be produced by irradiation of diamonds by high-energy particles. For example, ion implantation techniques can be used to create vacancy defects (347) in diamonds. The diamond nanocrystal can then be annealed at high temperatures to increase the mobility of the vacancies within the crystal lattice. The vacancies (345) naturally move to pair with the nitrogen atoms (340), creating a nitrogen vacancy defect (347). However, in some commercially available industrial diamond nanocrystals, the nitrogen vacancy defects are already present as a result of the manufacturing process.

Figure 3C:
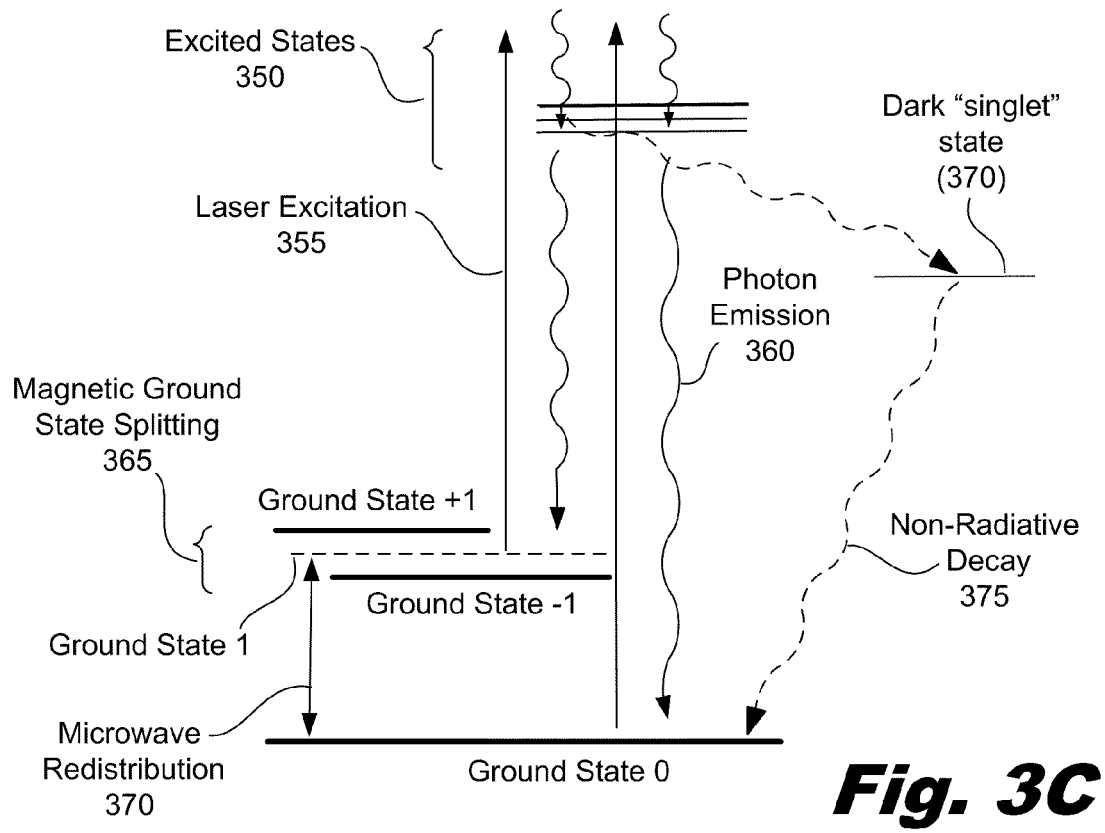
FIG. 3C is a diagram of illustrative electron states and transitions within a nitrogen vacancy defect, according to one embodiment of principles described herein.

One property of nitrogen vacancy defects (347) in a diamond lattice (330) is that the electrical state of electrons associated with the nitrogen vacancy defect (347) can be altered by a number of external stimuli. FIG. 3C is an illustration of various electron energy states in a nitrogen vacancy defect. The negatively charged state of the nitrogen vacancy defect (347, FIG. 3B) has at least three ground states, labeled by their spin projections onto the nitrogen-vacancy axis as ground state 0 and ground states +1 and −1. The application of an external magnetic field (325, FIG. 3A) to the nitrogen vacancy defect (347, FIG. 3B) shifts the energies of these three ground states relative to each other. The characteristics of this magnetically induced shift can be dependent on a number of factors including the orientation and magnitude of the external magnetic field.

Applying microwave radiation (320, FIG. 3A) to the nitrogen vacancy defect (346, FIG. 3B) causes a redistribution of the electron population between the ground states. The characteristics of this redistribution can depend on a number of factors including the frequency of the microwave radiation (320, FIG. 3A). According to one illustrative embodiment, the application of microwave radiation (320, FIG. 3A) with a frequency that is resonant with the energy difference between the ground state 0 and the ground states +1 or −1 causes a large redistribution of the population between ground state 0 and ground states +1, −1. The presence of a magnetic field (325, FIG. 3A) changes this resonant frequency by shifting the ground states ±1 to new energy levels relative to ground state 0.

Application of a photon flux (305, FIG. 3A) from the laser excitation source to the nitrogen vacancy defect (347, FIG. 3B) results in the laser excitation (355) of the electrons into excited states (350). The electrons quickly revert to one of the ground states by emitting a photon of a characteristic energy and wavelength, or through a non-radiative process. Electrons excited from ground state 0 emit a photon (360) with a high probability when they revert to the ground state. Electrons excited from ground state +1, −1 emit a photon with a lower probability when they revert to the ground state, and may instead become trapped for some time in a dark "singlet" state (370). The transition of the electrons from the dark "singlet" state (370) occurs via a non-radiative decay (375). No photon is emitted during the non-radiative decay (375) of the photon from a dark "singlet" state (370). As a result, transitions originating from the +1, −1 ground states exhibit relatively weak photoluminescence compared to transitions originating from the 0 ground state. These photons create the emitted photon flux (315, FIG. 3A). As discussed above, a portion of this photon flux (315, FIG. 3A) is captured by the microfiber loop (200, FIG. 1) and channeled to the photo detector (120).

To sense the presence, magnitude, and/or direction of a magnetic field (325, FIG. 3A), the microwave radiation (320, FIG. 3A) is swept through a frequency range. According to one illustrative embodiment, this frequency range roughly corresponds to the shifts in ground state resonant frequencies which would be expected to be produced by magnetic fields. When the microwave frequency does not correspond to the resonant frequency between ground state 0 and ground state −1, +1, the photo emission (360) is relatively bright because a larger portion of the electrons reside at ground state 0. The laser excitation (355) boosts these electrons from ground state 0 to one of the excited states (350). As discussed above, this results in a relatively bright photon emission (360). However as the microwave radiation frequency passes through the resonant frequency, a large portion of the electrons is redistributed from ground state 0 to ground state +1, −1. This results in a drop in the overall luminescence generated by the nanocrystal because of the lower photoemission generated by the transition between the excited states (350) to the ground states 0, +1, −1.

Consequently, to measure the magnetic field present at the nanocrystal, the nanocrystal (205, FIG. 3A) is illuminated with the incoming evanescent photon flux (305, FIG. 3A) and the microwave radiation (320, FIG. 3A) is swept through a frequency range. The emitted photon flux (315, FIG. 3A) is monitored for a reduction in magnitude. This frequency at which the reduction in emitted photon flux occurs corresponds to the resonant frequency between the ground state 0 and the ground states +1 or −1. Any change in this frequency from a nominal value can be interpreted as magnetically induced resonant frequency shift. The application of the appropriate calibration equation (s) then produces an estimation of the external magnetic field at the nanocrystal (205, FIG. 3A).

According to one illustrative embodiment, the emitted photon flux (315, FIG. 3A) has a wavelength longer that the incoming photon flux (305). The excitation laser (105, FIG. 1) may be one or more of a number of laser types and wavelengths. The optical energy generated by the excitation laser (105, FIG. 1) should have enough energy to excite relevant transitions between electron states but not so much energy that the nitrogen vacancy center is ionized. For example, for a nitrogen vacancy defect in a diamond crystal, optical wavelengths between 480 nm and 638 nm have been found to have sufficient energy to excite the relevant transition(s) without ionizing the defect. Optical energy in this wavelength range can be produced by a number of lasers. By way of example and not limitation, the excitation laser (105, FIG. 1) may be a laser diode, argon laser, krypton laser, frequency doubled Nd:YAG laser, dye lasers, or He—Ne lasers.

Additionally or alternatively, the microwave radiation frequency may be fixed on a resonance generated by a background magnetic field, effectively minimizing the photon emission from this field. Small magnetic field fluctuations from this background magnetic field will then produce increased photoemission and can then be measured by monitoring the change in photon flux at the fiber output. As a further alternative, a feedback circuit may be used to maintain the microwave radiation frequency close to a resonance such that the slope (the first derivative of the photoemission intensity with respect to the magnetic field intensity) is maximized, in order to maximize the signal-to-noise ratio of the magnetometer.

A portion of this emitted photon flux (305) is collected by the microfiber loop (200, FIG. 2) and directed back to the photodetector (120, FIG. 1). Consequently, small magnetic field fluctuations can then be measured by monitoring the change in photon flux received by the photodetector (120, FIG. 1). By scanning the position of the loop section (215) and the attached nanocrystal (205) across a target object, a magnetic field can be measured as a function of position. According to one illustrative embodiment, an array of microfiber magnetometers could be made. For example, a linear array of microfiber magnetometers could be used to quickly scan a target object such as a biological specimen or magnetic storage medium. A two dimensional array of microfiber magnetometers could be used to observe an ongoing biological reaction. For example, an array of microfiber magnetometers could be integrated into "labs on a chip" or microfluidic systems. In some embodiments, these arrays could allow magnetic field gradients to be quickly measured without mechanically scanning the array or the target. As discussed above, the signal measured by the photodetector (120, FIG. 1) is the photoluminescence intensity as a function of the microwave radiation frequency applied to the nanocrystal (205). By measuring the response of the photoluminescence signal to varying microwave radiation (320) frequencies the magnetic field can be measured.

The diamond crystal with nitrogen vacancy defects is only one example of a nanocrystal which exhibits optical detection of magnetic resonance. Other examples may include diamond crystals with other defects such as silicon or nickel centers, and other crystals such as silicon crystals, quantum nanodots, various oxides (such as magnesium oxide with implanted chromium ions), and various other compounds (such as gallium nitride).

Figure 4A:
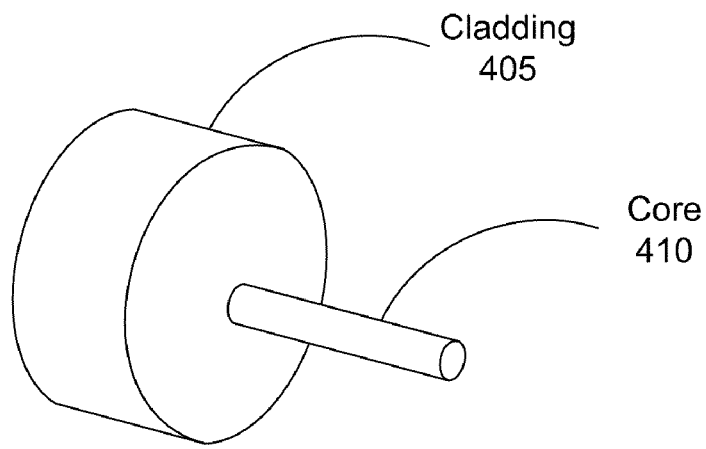
FIG. 4A is diagram of an illustrative fiber optic cable, according to one embodiment of principles described herein.

FIG. 4A is a perspective view of a fiber optic cable. A typical method for constructing fiber optic cables involves first constructing a large-diameter preform and then heating the preform and pulling it to form the optical fiber. While pulling the preform, a cladding (405) and core (410) portion are created. Additionally, to provide stability to the fiber optic cable, a jacket layer (not shown) and buffer layer (not shown) may also be applied over the cladding (405) and core (410). Due to the principle of total internal reflection, the light traveling through a fiber optic cable propagates through the core (405) by constantly bouncing off of the cladding (410). The light traveling through the fiber optic cable (110) evanescently extends into the cladding (415) but does not reach the surface. The core (410) of a conventional single-mode fiber optic cable has a diameter of 3-10 micrometers whereas the core (410) diameter in a multi-mode fiber optic cable can be around 10 micrometers or more.

Figure 4B:
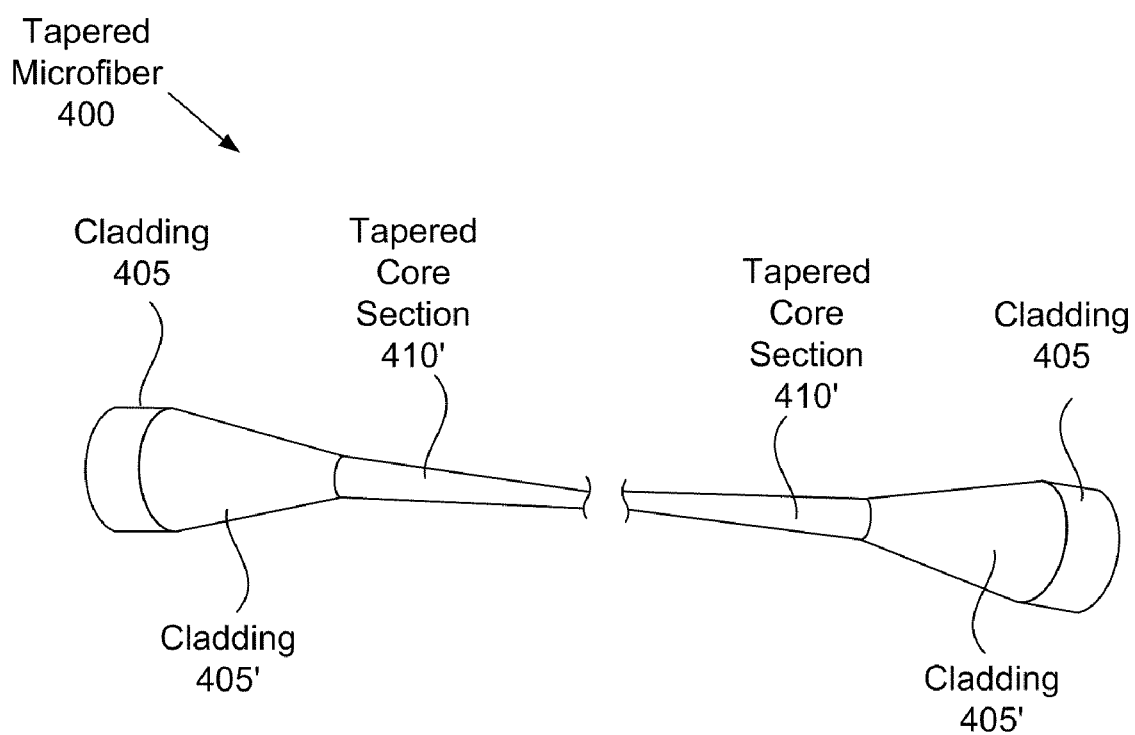
FIG. 4B is diagram of an illustrative tapered optical fiber according to one embodiment of principles described herein.

FIG. 4B shows a portion of an illustrative tapered microfiber (400). The tapered microfiber (400) is formed from a standard single mode fiber optic cable (110, FIG. 1) by heating and stretching the fiber (110, FIG. 1) until the minimum fiber (110, FIG. 1) diameter is less than two times the operating optical wavelength of the fiber. For example, if the operating wavelength is 532 nanometers, the microfiber would have a diameter of no greater than 1064 nanometers at its narrowest point. In this process, the fiber optic cable (110, FIG. 1) is stretched such that there is a gradual change from the regular fiber optic cable (110, FIG. 1) structure to the tapered section (210, FIG. 2). Specifically, the cladding (405, FIG. 4*a*) is stretched into a gradual tapered cladding section (405'). Additionally, the core (410) is stretched into a gradual tapered core section (410'). This tapered section (210, FIG. 2) gradually returns to the normal shape of a fiber optic cable (110, FIG. 1), the tapered core section (410') and tapered cladding section (405') gradually increase in size at the opposing end of the microfiber optical loop (200).

Tapering the fiber optic cable (110, FIG. 1) to sub-micrometer widths allows the photons (305, FIG. 3) emitted from the excitation laser (105, FIG. 1) to evanescently propagate outside of the fiber (110, FIG. 1). In this way the excitation laser (105, FIG. 1) can excite the nitrogen vacancy defects (310, FIG. 3) inside of the nanocrystal (205, FIG. 2) placed on the surface of the loop section (215, FIG. 2). Additionally, the emitted photons from the nanocrystal can be collected by the loop section (215, FIG. 2) and directed to the photodetector (120, FIG. 1).

Figure 5:
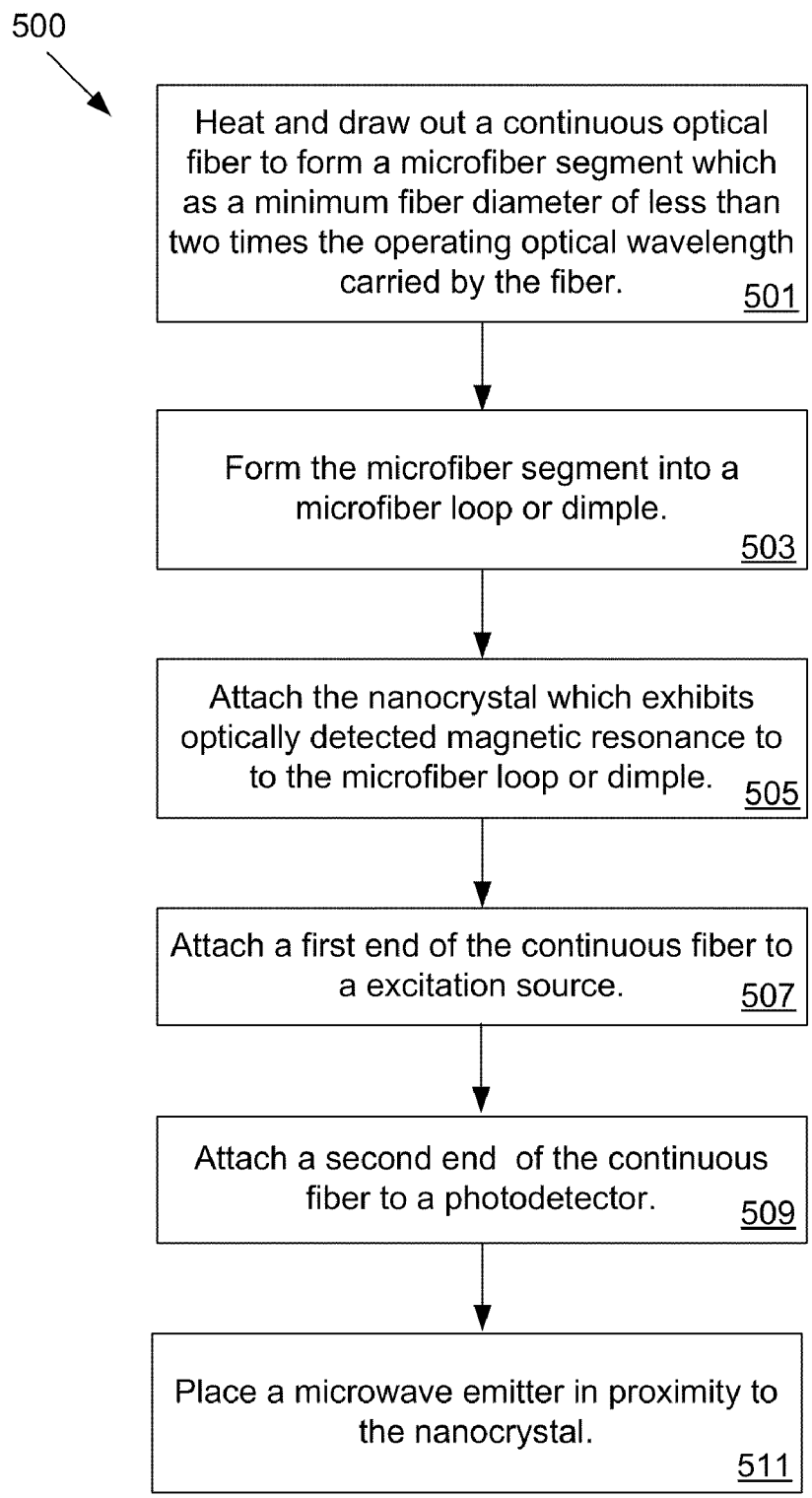
FIG. 5 is a flowchart of an illustrative method for forming a tapered microfiber magnetometer, according to one embodiment of principles described herein.

FIG. 5 is a flowchart of an illustrative method (500) for forming a tapered microfiber magnetometer. According to one illustrative embodiment, a continuous optical fiber is heated and drawn out to a microfiber segment with a minimum fiber diameter of less than two times the wavelength of the operating optical wavelength carried by the fiber (step 501). The microfiber segment is formed into a microfiber loop or dimple (step 503). A nanocrystal which contains a defect which exhibits optically detected magnetic resonance is attached to the microfiber loop or dimple (step 505). According to one illustrative embodiment, the nanocrystal is a diamond nanocrystal with nitrogen vacancy defect(s). As discussed above, the nanocrystal may be attached to the microfiber by van der Waals forces, electrostatic forces, adhesive, or combinations thereof. A first end of the continuous fiber is optically connected to an excitation source such that optical energy from an excitation source passes into the continuous fiber (step 507). A second end continuous fiber is optically connected a photodetector such that an emitted photon flux from the nanocrystal is incident on the photodetector (step (509). According to one illustrative embodiment, an optical filter is placed in the path of the emitted photon flux to separate it from the optical energy produced by the excitation source. A microwave emitter is placed in proximity to the nanocrystal (step 511) such that microwave radiation generated by the microwave emitter is incident on the nanocrystal.

Figure 6:
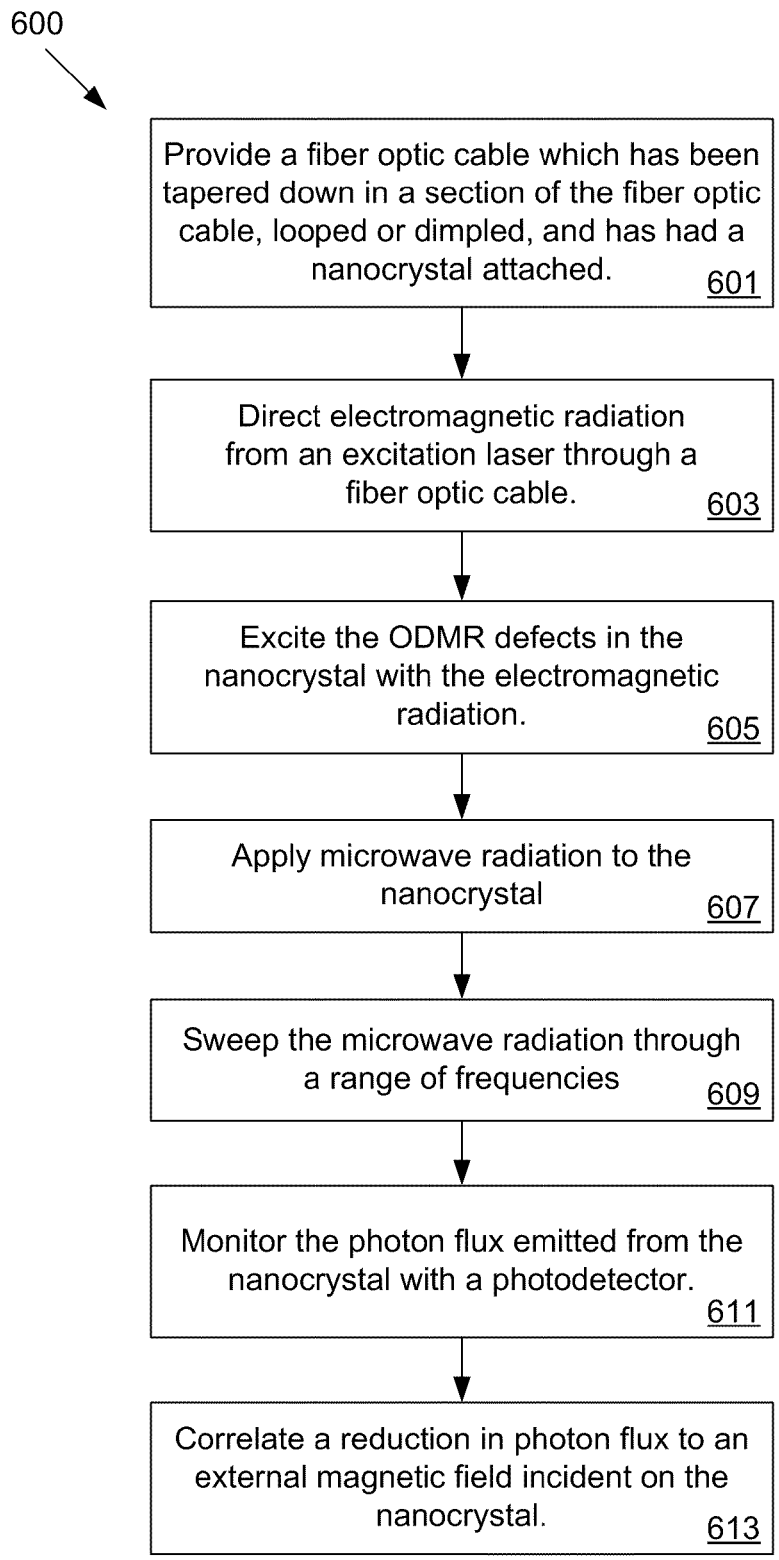
FIG. 6 is a flowchart of an illustrative method of measuring a magnetic field using a tapered microfiber magnetometer, according to one embodiment of principles described herein.

FIG. 6 is a flowchart of an illustrative method (600) for detecting a magnetic field using a tapered microfiber magnetometer. The method (600) includes providing (step 601) a fiber optic cable which has been tapered down to form a microfiber, which is then looped or dimpled to provide protruding section of fiber, and a nanocrystal is attached to the loop. Electromagnetic radiation from an excitation laser (105, FIG. 1) is directed (step 603) through a fiber optic cable (110, FIG. 1). The electromagnetic radiation excites (step 605) the ODMR defects in the nanocrystal. As used in the specification and appended claims, the term "ODMR defect" refers to a defect within a crystalline structure whose optical characteristics are sensitive to magnetic fields. According to one illustrative embodiment, the ODMR defects are nitrogen vacancy defects in a diamond crystal.

Microwave radiation is then applied to the nanocrystal (step 607) and swept through a range of frequencies (step 609). As discussed above, this range of frequencies includes a frequency or frequencies which are resonant with a ground state splitting of the nanocrystal. The photon flux emitted from the nanocrystal is then monitored by a photodetector (step 611) to detect a reduction in photon flux which occurs when the microwave radiation frequency is resonant to a ground state transition. This reduction in photon flux is then correlated using a calibration equation or by other appropriate means to calculate the external magnetic field incident on the nanocrystal (step 613).

Advantages of the microfiber magnetometer described above include low cost, small volume, high sensitivity and high resolution. A single continuous fiber is used to both excite the nanocrystal defects and collect the emitted photons. The microfiber portion of the fiber carries a highly confined guided optical mode which promotes evanescent optical coupling with a high transmission efficienly. The mechanical structure of the microfiber magnetometer is inexpensive and relatively simple to construct. Additionally, the sensor portion of the magnetometer is a very compact device. For example, the sensor does not require any macro-optics, such as optical microscopes, beam splitters, mirrors or lenses to be used in the sensor portion. In one illustrative embodiment, the sensor could have a size smaller than approximately 250 nanometers. This small size produces very high spatial resolution. If the sensor is damaged, it can be removed and a new sensor can be "plugged in" without replacing any other supporting measurement hardware. Because the sensor requires only an optical fiber connection to the support hardware, it can be remotely used from the support hardware. This provides significantly more flexibility in operating the device in relative inaccessible locations or chemically hostile environments. For example, the fiber could be submerged in biological fluids or used as part of a remote environmental sensing instrument. These advantages could provide significantly benefits to geophysicists, biologists, neuroscientists.

In sum, the microfiber magnetometer is a probe for measuring magnetic fields with high sensitivity and high spatial resolution. By spatially scanning the probe above a sample surface or other region of interest, high resolution images of the local magnetic field can be constructed. The probe can be inexpensively fabricated, and is fiber coupled, allowing it to be plugged into a wide variety of existing optical hardware suitable for analyzing its output. This fiber coupled packaging also allows the probe to operate in a wide range of environments.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A magnetometer comprising:
   a tapered microfiber having a curved portion;
   an excitation laser configured to be in optical communication with the tapered microfiber; and
   a nanocrystal configured to be attached to the curved portion of the tapered microfiber;
   in which laser light emitted from the excitation laser is coupled to a first end of the tapered microfiber and interacts with the nanocrystal to create an emitted photon flux which is monitored to detect a magnetic field passing through the nanocrystal.

2. The magnetometer of claim 1, in which the nanocrystal is attached to the curved portion of the tapered microfiber using at least one of: van der Waals forces and electrostatic forces.

3. The magnetometer of claim 1, further comprising an adhesive configured to bond the nanocrystal to the curved portion of the tapered microfiber.

4. The magnetometer of claim 1, in which the tapered microfiber has a minimum fiber diameter of less than two times an optical wavelength of the laser light.

5. The magnetometer of claim 1, in which the nanocrystal is a diamond nanocrystal.

6. The magnetometer of claim 5, in which the diamond nanocrystal comprises one or more nitrogen-vacancy defects.

7. The magnetometer of claim 1, further comprising a microwave emitter configured to emit microwave radiation incident on the nanocrystal.

8. The magnetometer of claim 7, in which the microwave emitter is configured to emit microwave radiation whose frequency is swept through a range which includes a frequency resonant with a ground state splitting of the electronic structure of the nanocrystal.

9. The magnetometer of claim 1, further comprising an optical detector configured to be optically coupled a second end of the tapered microfiber and detect the emitted photon flux.

10. The magnetometer of claim 1, further comprising an optical filter configured to be optically interposed between the microfiber and the optical detector such that the optical filter blocks the laser light emitted by the excitation laser from reaching the optical detector.

11. The magnetometer of claim 1, in which the curved portion of the tapered microfiber is a microfiber loop.

12. The magnetometer of claim 1, in which the curved portion of the tapered microfiber is a microfiber dimple.

13. A method for using a microfiber magnetometer for measuring a magnetic field comprises:
   directing electromagnetic radiation from an excitation laser through a first end of an fiber optic cable, wherein the fiber optic cable has been tapered down to form a microfiber loop and has a nanocrystal attached to the microfiber loop;
   applying microwave radiation to the nanocrystal;
   sweeping the microwave radiation through a range of frequencies;
   monitoring photon flux emitted by a second end of the fiber optic cable for a reduction in photon flux produced by the nanocrystal;
   correlating the reduction in photon flux to an external magnetic field incident on the nanocrystal.

* * * * *